(12) United States Patent
Masumoto et al.

(10) Patent No.: US 7,250,642 B2
(45) Date of Patent: Jul. 31, 2007

(54) FIELD-EFFECT TRANSISTOR

(75) Inventors: Yasuyuki Masumoto, Ohtsu (JP); Atsushi Watanabe, Kadoma (JP); Kenichi Hidaka, Takatsuki (JP); Eiji Yasuda, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/189,842

(22) Filed: Jul. 27, 2005

(65) Prior Publication Data

US 2006/0022218 A1 Feb. 2, 2006

(30) Foreign Application Priority Data

Jul. 29, 2004 (JP) .............................. 2004-221568

(51) Int. Cl.
*H01L 29/772* (2006.01)
*H01L 29/778* (2006.01)

(52) U.S. Cl. ................ 257/192; 257/194; 257/E29.12; 257/E29.246

(58) Field of Classification Search ................ 257/170, 257/192, 226, 240, 465, 504, 510, E23.015, 257/E29.257, E29.063, E29.064, 194, 284, 257/287, 267, 401, 341, E29.12, E29.026, 257/E29.027, E29.136, E29.246–E29.254
See application file for complete search history.

(56) References Cited

U.S. PATENT DOCUMENTS

| 4,462,041 A * | 7/1984 | Glenn ........................ 257/401 |
| 6,940,705 B2 * | 9/2005 | Yeo et al. ................... 361/302 |
| 2005/0116253 A1 * | 6/2005 | Yamane et al. ............. 257/194 |

FOREIGN PATENT DOCUMENTS

| JP | 2110943 | 4/1990 |
| JP | 5251479 | 9/1993 |
| JP | 6163604 | 6/1994 |
| JP | 2005-072671 | 3/2005 |

OTHER PUBLICATIONS

U.S. Appl. No. 11/127,178, filed May 12, 2005.
English Language abstract of JP-6-163604, Nov. 26, 1992.
English Language abstract of JP-2005-72671, Aug. 27, 2003.
English Language abstract of JP-2-110943, Oct. 19, 1988.
English Language abstract of JP-5-251479, Nov. 27, 1991.

\* cited by examiner

*Primary Examiner*—Kenneth Parker
*Assistant Examiner*—Matthew C. Landau
(74) *Attorney, Agent, or Firm*—Greenblum & Bernstein, P.L.C.

(57) ABSTRACT

The present invention, which aims to provide a gallium arsenide field-effect transistor that can reduce degradation of field-effect transistor characteristics, and to realize miniaturization of the transistor, includes: a substrate; a mesa which includes a channel layer and is formed on the substrate; a source electrode formed on the mesa; a drain electrode; and a gate electrode, wherein, on the mesa, a top pattern is formed in which finger portions of the source electrode and the drain electrode which are formed in comb-shape are located so as to interdigitate, and a gate electrode is formed between the source electrode and the drain electrode, while common portions, which are base parts of the finger portions of the source and drain electrodes, are formed on the surface of the mesa, and the part located below the straight portion which is parallel to the finger portions of the gate electrode is electrically separated from the part located below a corner portion that connects neighboring straight portions of the gate electrode.

11 Claims, 9 Drawing Sheets

FIG. 1

Priort Art

FIG. 2

Priort Art

Prior Art

FIG. 3C

Prior Art

FIG. 3D

Prior Art

FIELD-EFFECT TRANSISTOR

BACKGROUND OF THE INVENTION (1) Field of the Invention

The present invention relates to a field-effect transistor, and in particular, to a process of manufacturing the field-effect transistor that operates with stability, which allows the transistor to be miniaturized.

(2) Description of the Related Art

Figure 1:
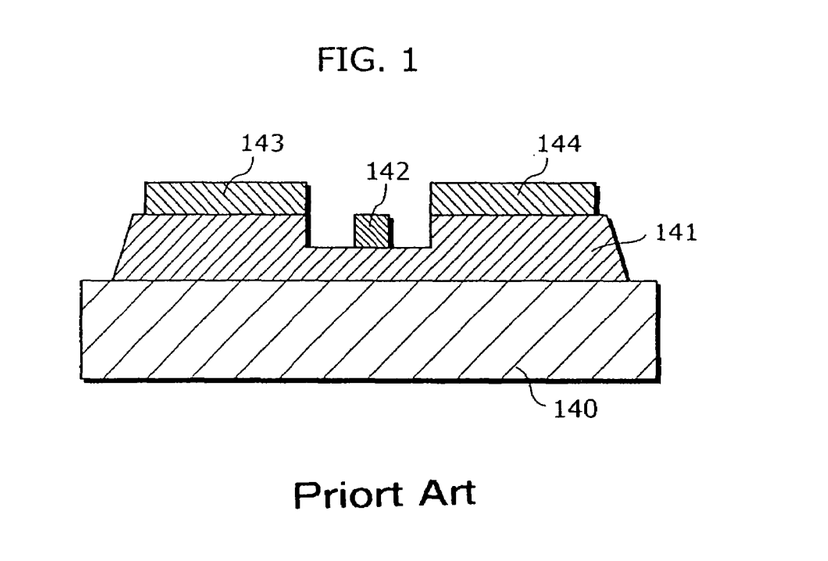
FIG. 1 is a cross-sectional view of the GaAs FET described in Japanese Laid-Open Patent Application No. 6-163604.

As a field-effect transistor (hereinafter to be referred to as "FET"), a gallium arsenide field-effect transistor (hereinafter to be referred to as "GaAs FET") as disclosed in Japanese Laid-Open Patent Application No. 6-163604 can be taken as an example. FIG. 1 is a cross-sectional view of a structure of the GaAs FET described in the patent literature as mentioned above.

In the GaAs FET, a mesa 141 having a channel layer (i.e. active layer) is formed on a semi-insulating substrate 140, while a gate electrode 142, a source electrode 143 and a drain electrode 144 are formed on the mesa 141.

Figure 2:
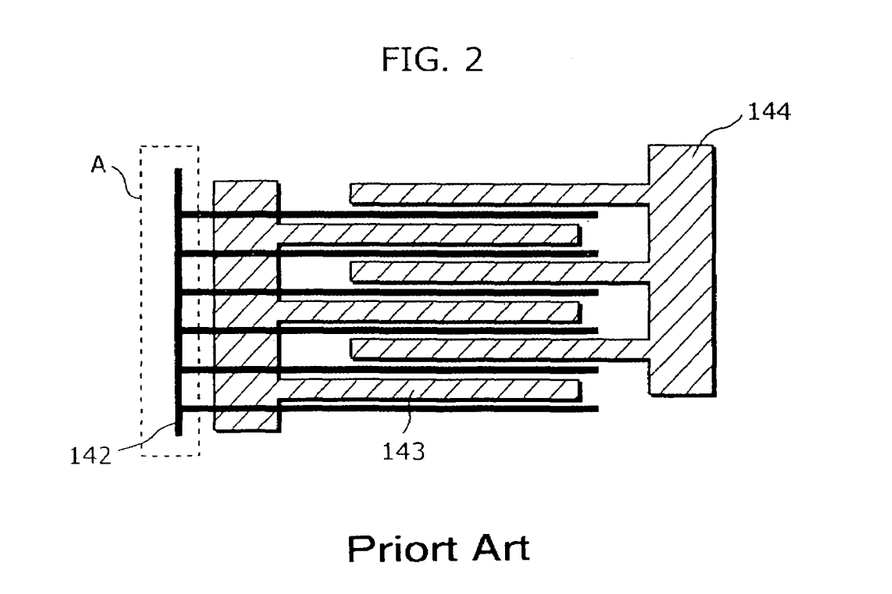
FIG. 2 is a top view of the conventional GaAs FET.

FIG. 2 is a top view of the GaAs FET having the structure as described above.

The GaAs FET is a multi-finger FET in which plural unit FETs are electrically connected in parallel. Such GaAs FET has a wiring layout in which the finger portions of the respective source electrode 143 and drain electrode 144 are positioned opposite each other so as to interdigitate, and the finger portions of the comb-shaped gate electrode 142 are formed between the source electrode 143 and the drain electrode 144.

In the GaAs FET having the wiring layout as shown in FIG. 6, it is necessary to reserve a space outside the transistor for forming a common portion (a part A indicated by a dotted line in FIG. 2) that is a base part of the finger portions of the gate electrode 142. Therefore, it is difficult to reduce the chip size of such GaAs FET.

Figure 3A:
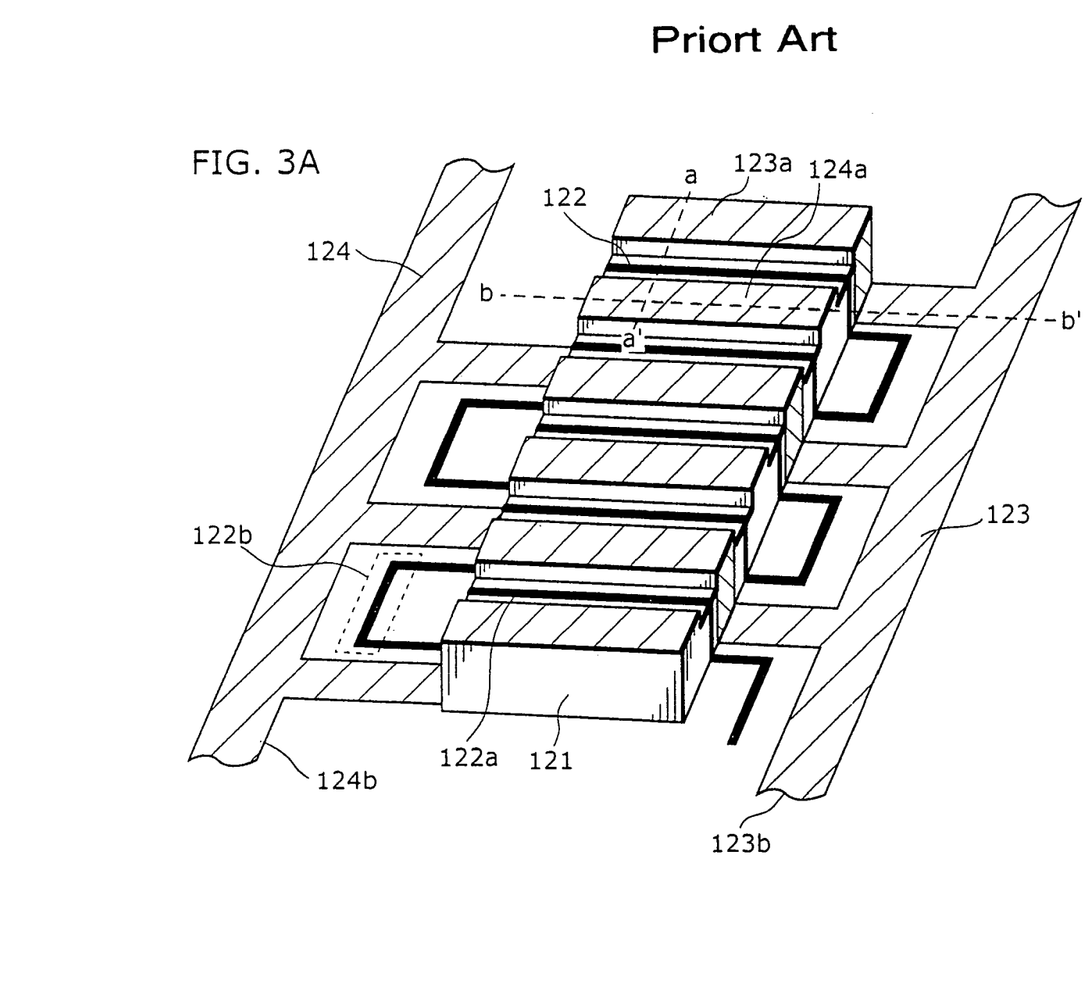
FIG. 3A is an outer view of the conventional GaAs FET.
Figure 3B:
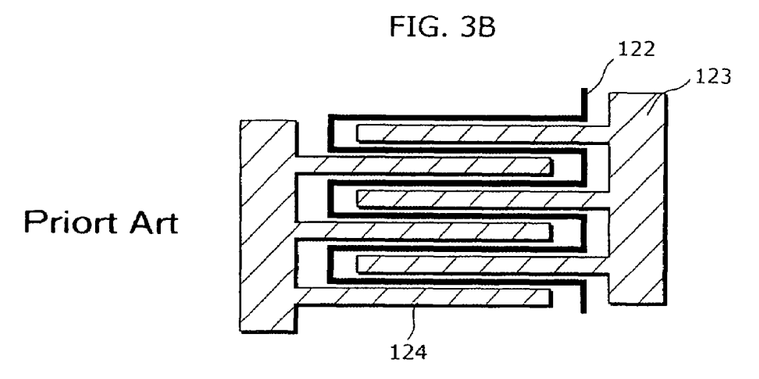
FIG. 3B is a top view of the conventional GaAs FET.
Figure 3C:
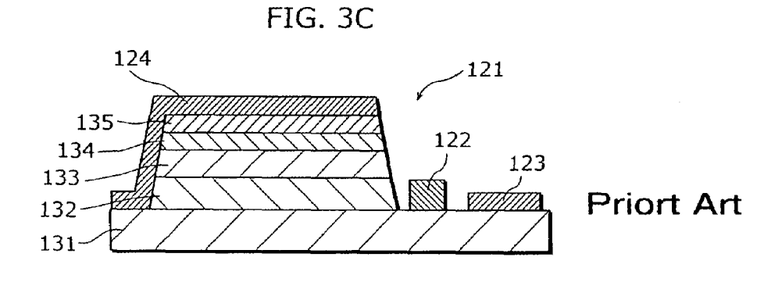
FIG. 3C is a cross-sectional view, at the line b-b' shown in FIG. 3A, of the conventional GaAs FET.
Figure 3D:
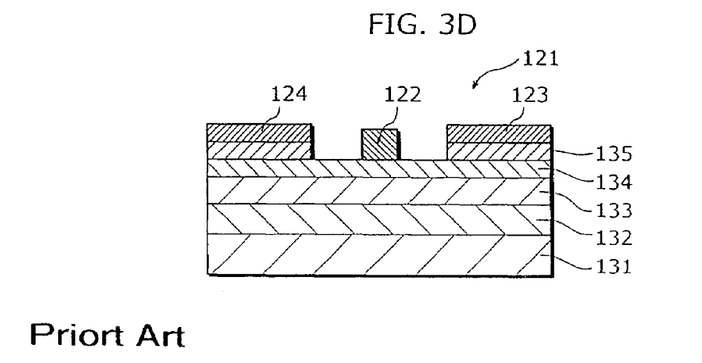
FIG. 3D is a cross-sectional view, at the line a-a' shown in FIG. 3A, of the conventional GaAs FET.

The respective structures shown in FIGS. 3A, 3B, 3C and 3D are some examples (see reference to Japanese Laid-Open Patent Application No. 2005-72671) of the conventional GaAs FET that solves the above problem. FIG. 3A is an outer view of the GaAs FET and FIG. 3B is a top view of the GaAs FET, while FIG. 3C is a cross-sectional view of the GaAs FET at the line b-b' shown in FIG. 3A and FIG. 3D is a cross-sectional view of the GaAs FET at the line a-a' shown in FIG. 3A.

In such GaAs FET, a GaAs epitaxial layer 132, a GaAs layer 133 that is to become an operating layer, a AlGaAs layer 134 that is to become a carrier supplying layer, and an n-type GaAs layer 135 that is to become a contact layer with low resistance are sequentially stacked on a substrate 131 that is made of semi-insulating GaAs. Here, the source electrode 123 and the drain electrode 124 are formed on the n-type GaAs layer 135 while the gate electrode 122 is formed on the AlGaAs layer 134. The mesa 121 is made up of the GaAs epitaxial layer 132, the GaAs layer 133, the AlGaAs layer 134 and the n-type GaAs layer 135.

The GaAs FET has a wiring layout in which finger portions 123a and 124a of the respective comb-shaped source electrode 123 and drain electrode 124 are positioned opposite each other so as to interdigitate and the gate electrode 122 is formed in meandering-shape between the drain electrode 123 and the drain electrode 124.

Here, the finger portions 123a and 124a of the respective source electrode 123 and drain electrode 124, and a straight portion 122a of the gate electrode 122 are formed on the mesa 121. The common portions 123b and 124b of the finger portions 123a and 124a of the respective source electrode 123 and drain electrode 124, and a corner portion 122b of the gate electrode 122 are formed on the substrate 131.

The GaAs FET having the structure as described above has a wiring layout in which the meandering gate electrode 122 is formed between the source electrode 123 and the drain electrode 124. Therefore, it is possible to eliminate the common portions of the gate electrode 122, so that the GaAs FET that allows the reduction of the chip size can be realized.

According to the GaAs FET having the above structure, the corner portion 122b of the gate electrode 122 is not formed on the mesa 121 that includes a channel layer. Thus, it is possible to prevent the part located below the corner portion 122b of the gate electrode 122, that is, the part that does not operate as a stable FET, from operating as a FET. As a result, it is possible to realize the GaAs FET that can operate, as a whole, with stability, so as to obtain desired characteristics.

SUMMARY OF THE INVENTION

According to the conventional GaAs FET, since the finger portions 123a and 124a of the source electrode 123 and the drain electrode 124 are formed on the GaAs layer 135 of the mesa 121, a metallic-metallic bond is formed between the finger portions 123a and 124a, and the semiconductor layer, so that an ohmic junction is formed. Since the common portions 123b and 124b of the source electrode 123 and the drain electrode 124 are formed on the substrate 131, a metallic-semiconductor junction is formed between the common portions 123b and 124b, and the semiconductor layer, so that a Schottky junction is formed. With the Schottky junction formed between the source electrode 123 and the semiconductor layer, in the case where a potential difference is generated between the drain and the source, the electrons move from the source side to the drain side. As a result, a leakage current flows (i.e. side gate effect). The conventional GaAs FET, therefore, degrades field-effect transistor characteristics. More precisely, the electrons that have moved to the drain side prevent a depletion layer from being enlarged, which causes degradation of various high-frequency characteristics such as insertion loss, isolation and the like. In order to reduce such side gate effect, it is necessary to maintain a certain distance between drain and source. This prevents the miniaturization of the transistor.

The present invention is conceived in view of the above problem, and an object of the present invention is to provide a small field-effect transistor that can reduce degradation of the field-effect transistor characteristics.

In order to achieve the above object, the field-effect transistor according to the present invention includes: a substrate; a mesa which is formed on the substrate and includes a channel layer; and a source electrode, a drain electrode and a gate electrode which are formed on the mesa, the source and drain electrodes respectively being formed in comb-shape, and the gate electrode being formed in meandering-shape; wherein, on the mesa, a top-surface pattern in which respective finger portions of the source electrode and the drain electrode are positioned opposite each other so as to interdigitate, and the gate electrode is formed between the source electrode and the drain electrode is formed, common portions, each being a base part of the finger portions of the source and drain electrodes, are formed on the mesa, and in the gate electrode, a part located below a straight portion which is parallel to the finger portions is electrically separated from a part located below a corner portion that connects the neighboring straight portions. The part located below the corner portion of the gate electrode in said mesa may not function as a transistor. A trench may be formed in the mesa, cutting across the channel layer, and the corner portion of the gate electrode may be formed in the trench. A high-resistance region may be formed in the mesa, cutting across the channel layer, and the corner portion of the gate electrode may be formed on the high-resistance region.

Thus, the gate electrode is to be formed in meandering shape, which enables reduction of the size of chip. Both of the finger portions and the common portions of the source electrode and the drain electrode are formed on the mesa, so that it is possible to eliminate the side gate effects and reduce the degradation of field-effect transistor characteristics. The elimination of the side gate effects simultaneously encourages the shortening the drain-source distance and thereby realizes the miniaturization of the GaAs FET. That is to say that it is possible to realize a small field-effect transistor that can reduce the degradation of field-effect transistor characteristics.

It is also possible to stabilize the operation of the field-effect transistor since the lower part of the straight portion of the gate electrode is separated from the lower part of the corner portion of the gate electrode due to the trench or high-resistance region so that the transistor located in the corner portion of the gate electrode stops its operation.

The mesa may have a layer structure in which a buffer layer, the channel layer, a carrier supplying layer, a Schottky layer and a contact layer are sequentially stacked, the trench may be formed by etching which is performed on the contact layer so that the buffer layer is exposed, the finger portions and the common portions of the respective source and drain electrodes may be formed on the contact layer, and the corner portion of the gate electrode may be formed on the buffer layer which is exposed as a result of the formation of the trench. The mesa may have a layer structure in which the buffer layer, the channel layer, the carrier supplying layer, the Schottky layer and the contact layer are sequentially stacked, the high-resistance region may be formed, reaching the buffer layer, by implantation of impurities onto the contact layer, the common portions and the finger portions of the source and drain electrodes may be formed on the contact layer, and the corner portion of the gate electrode may be formed on the high-resistance region which is partly formed in the contact layer.

Thus, it is possible to realize a small HEMT that can reduce the degradation of field-effect transistor characteristics. It is also possible to realize an HEMT that can operate with stability.

The finger portions and the common portions of the source and drain electrodes may be formed so that the surface of the finger portions flush with the surface of the common portions.

Thus, it is possible to realize a field-effect transistor that requires low cost due to the simple manufacturing of the transistor.

A top surface of the substrate may be at a (100) basal plane, and an angle θ formed between a direction of the straight portion of the gate electrode and a direction <0-1-1> of the substrate may be 45 degrees.

Thus, it is possible to prevent the variation in threshold voltages of the field-effect transistor due to piezo effect, and thereby to stabilize the field-effect transistor characteristics.

As described above, the field-effect transistor according to the present invention, it is possible to reduce the chip size. The degradation of the field-effect transistor characteristics due to the side gate effect caused in the source electrode or drain electrode can be reduced. Namely, it is possible to realize a small field-effect transistor that can reduce the degradation of the field-effect transistor characteristics. Moreover, instability of the operation due to the difference in the direction in which the gate electrode is placed can be overcome, so that it is possible to stabilize the field-effect transistor characteristics.

Further Information about Technical Background to this Invention

The disclosure of Japanese Patent Application No. 2004-221568 filed on Jul. 29, 2004, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

The following describes the GaAs FET according to the embodiments of the present invention, with reference to the diagrams.

First Embodiment

Figure 4A:
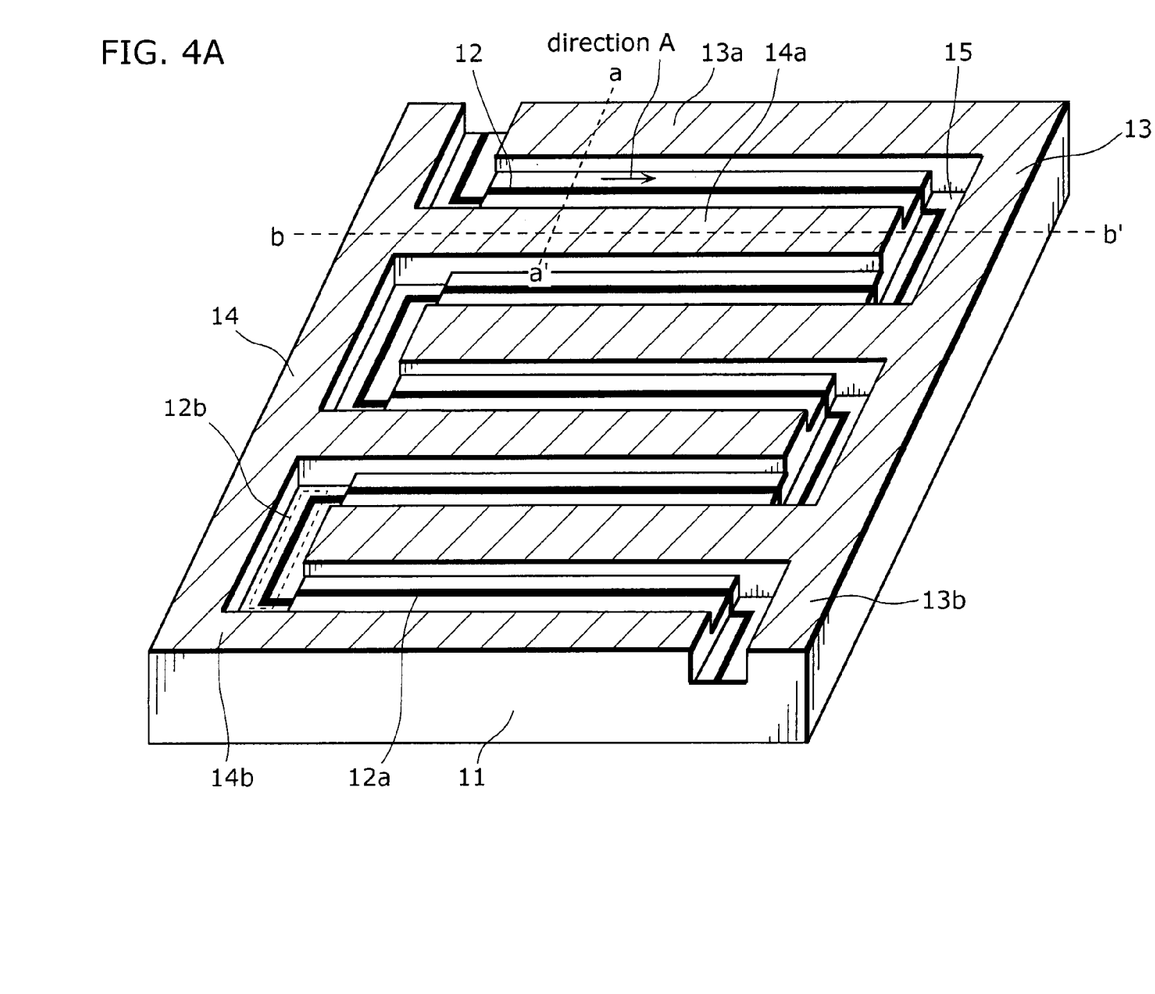
FIG. 4A is an outer view of a GaAs FET according to a first embodiment of the present invention.
Figure 4B:
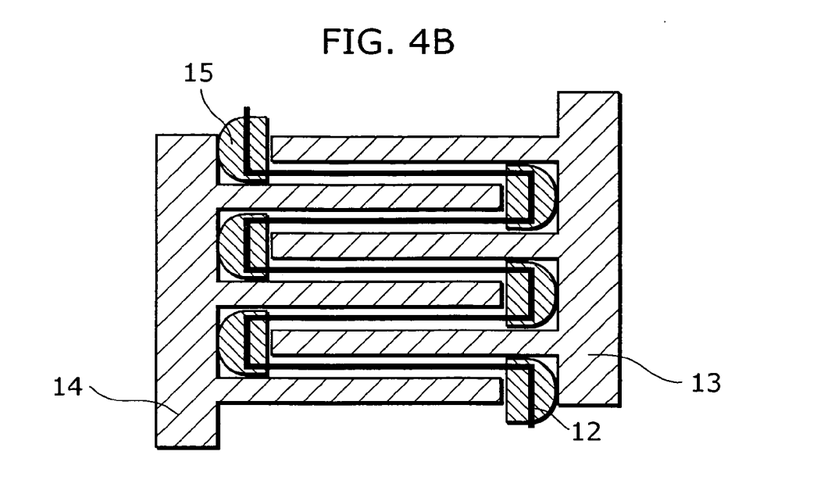
FIG. 4B is a top view of the GaAs FET according to the first embodiment.
Figure 4C:
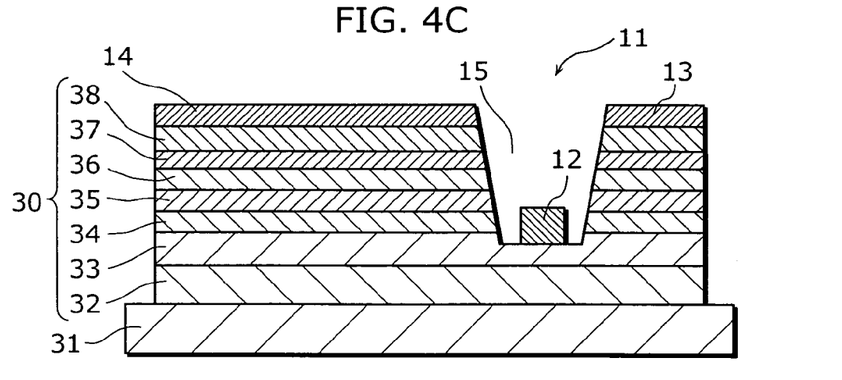
FIG. 4C is a cross-sectional view, at the line b-b' shown in FIG. 4A, of the GaAs FET according to the first embodiment.
Figure 4D:
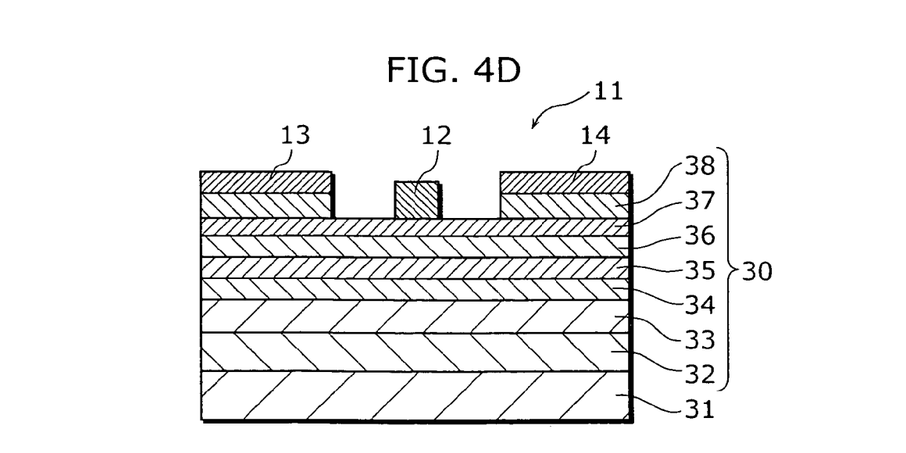
FIG. 4D is a cross-sectional view, at the line a-a' shown in FIG. 4A, of the GaAs FET according to the first embodiment.

FIG. 4A shows an outer view of the GaAs FET according to the present embodiment and FIG. 4B shows a top view of the GaAs FET, while FIG. 4C shows a cross-sectional view of the GaAs FET, at the line b-b' shown in FIG. 4A, and FIG. 4D shows a cross-sectional view of the GaAs FET at the line a-a' shown in FIG. 4A.

The GaAs FET is comprised of a substrate 31 made of semi-insulating GaAs, and an epitaxial layer 30 formed by mesa separation due to an element separation region after a semiconductor layer is grown by crystal growth on the substrate 31. The epitaxial layer 30 includes the following layers which are sequentially stacked: a buffer layer 332 which has a thickness of 1 μm and is made of undoped GaAs, for alleviating lattice mismatch between the epitaxial layer 30 and the substrate 31,; a buffer layer 33 made of undoped AlGaAs; a channel layer 34 which is made of undoped $In_{0.2}Ga_{0.8}As$ with a thickness of 20 nm, and in which carriers run; a spacer layer 35 made of undoped AlGaAs with a thickness of 5 nm; a carrier supplying layer 36 made of AlGaAs resulted from planar doping performed only on one atomic layer of Si being an n-type impurity ion; a Schottky layer 37 made of undoped AlGaAs with a thickness of 30 nm; a contact layer 38 made of $n^+$-type GaAs with a thickness of 100 nm. Here, the source electrode 13 and the drain electrode 14 are formed on the contact layer 38. In the area between the source electrode 13 and the drain electrode 14, etching is performed on the contact layer 38 so that the surface of the Schottky layer 37 is exposed as a surface of the epitaxial layer 30, the gate electrode 12 is formed on the Schottky layer 37 that is thus exposed.

The GaAs FET is a multi-finger FET in which plural unit FETs are connected electrically and in parallel, and has a layout in which the finger portions 13a and 14a of the comb-shaped source electrode 13 and drain electrode 14 are placed opposite each other so as to interdigitate, and one gate electrode 12 is formed in meandering shape between the source electrode 13 and the drain electrode 14. That is to say that the GaAs FET has a layout in which each finger portion 13a of the source electrode 13 and each finger portion 14a of the drain electrode 14 are placed one after the other, and the finger portions 13a of the source electrode 13 are connected to the common portion 13b that is a base part of the finger portions 13a, while the finger portions 14a of the drain electrode 14 are connected to the common portion 14b that is a base part of the finger portions 14a.

The followings are formed on the mesa 11: the finger portions 13a and 14a as well as the common portions 13b and 14b of the respective source electrode 13 and drain electrode 14; the straight portion 12a of the gate electrode 12 that is almost in parallel to the finger portion 13a; and the corner portion 12b which connects the neighboring straight portions 12a.

The mesa 11 is formed by the buffer layers 32 and 33, the channel layer 34, the spacer layer 35, the carrier supplying layer 36, the Schottky layer 37 and the contact layer 38. Since the direction of the gate electrode 12 is different between the corner portion 12b and the straight portion 12a, variation in threshold voltages of the field-effect transistor is generated due to piezo effect, which causes instability of the FET characteristics. Therefore, in the part located below the corner portion 12b of the gate electrode 12 in the mesa 11, a gate electrode separation trench 15 is formed by etching so that it reaches the buffer layer 33 across the channel layer 34, the spacer layer 35, the carrier supplying layer 36, the Schottky layer 37 and the contact layer 38. The part located below the corner portion 12b is electrically separated from the part located below the straight portion 12a, and therefore, does not function as a transistor. The top surface of the substrate 31 is at a (100) basal plane, and a direction of the straight portion 12a of the gate electrode 12 (direction A in FIG. 4A) is adjusted to make every angle θ formed between the direction of the straight portion 12a of the gate electrode and the direction <0-1-1> of the substrate to be 45 degrees.

The following describes the method of manufacturing the GaAs FET having the structure as described above, with reference to the diagrams.

FIGS. 5(a) through 5(e) are cross-sectional views of the GaAs FET.

Figure 5:
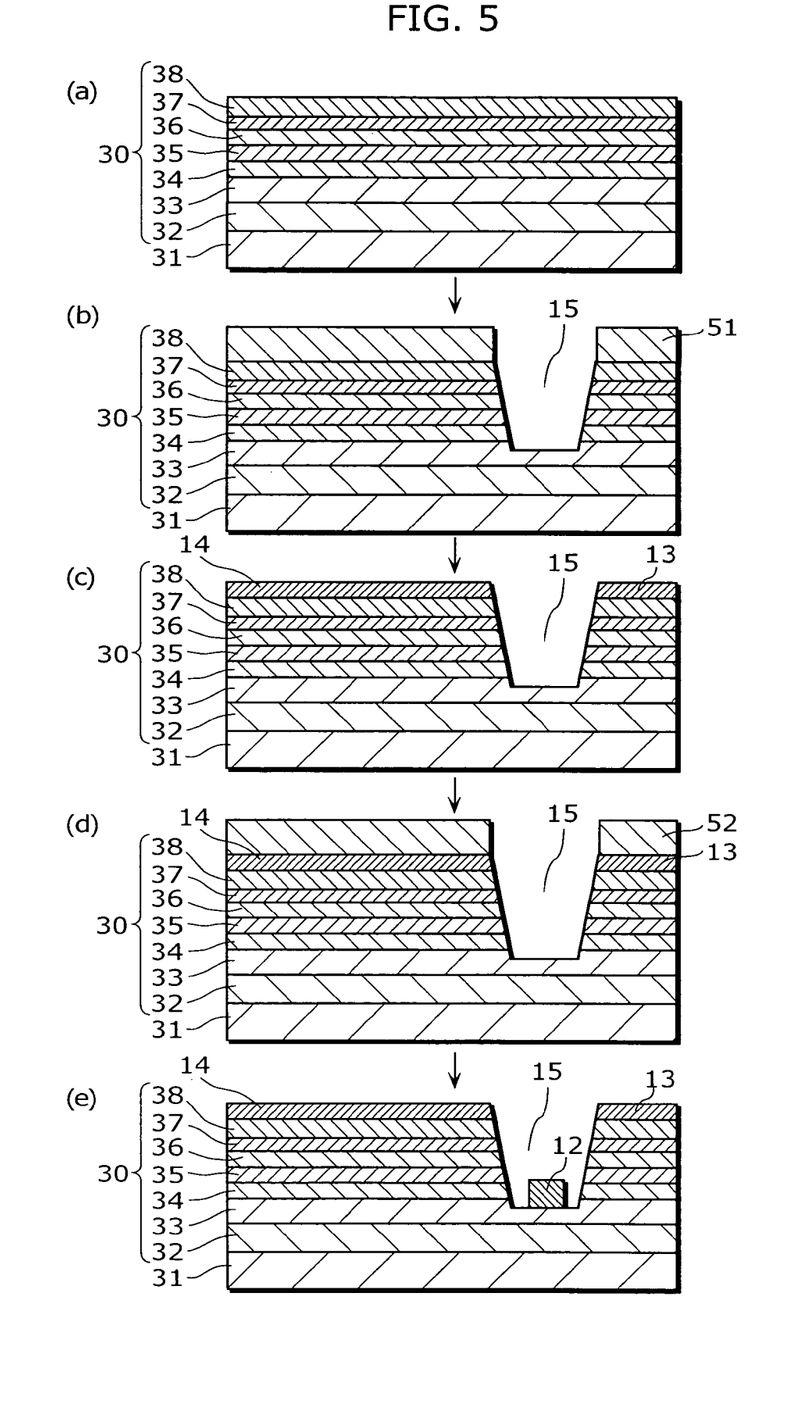
FIGS. 5(a) through 5(e) are cross-sectional views of the GaAs FET according to the first embodiment for describing a manufacturing method of the GaAs FET according to the first embodiment.

Firstly, the epitaxial layer 30 is formed on the substrate 31 by sequentially growing, with the use of an MOCVD method or an MBE method, the buffer layers 32 and 33, the channel layer 34, the spacer layer 35, the carrier supplying layer 36, the Schottky layer 37 and the contact layer 38 (see FIG. 5(a)).

Then, a predetermined place is protected by forming a pattern using a photo resist 51. Wet etching using, for example, a solution of phosphoric acid, oxygenated water and water, is performed on the epitaxial layer 30 so that predetermined areas of the contact layer 38, the Schottky layer 37, the carrier supplying layer 36, the spacer layer 35, the channel layer 34, and the buffer layer 33 are removed and an element separation region and a gate electrode separation trench 15 are formed (see FIG. 5(b)).

After the removal of the photo resist 51, a pattern is formed using another photoresist, an ohmic metal made of metal composed of Ni, Au and Ge is vapor-deposited all over the surface of the epitaxial layer 30, and by lifting it off, the drain electrode 14 and the source electrode 13 are formed (see FIG. 5(c)).

After the formation of the photo resist 52, an opening is formed by performing recess etching onto a predetermined area of the contact layer 38 between the source electrode 13 and the drain electrode 14 (see FIG. 5(d)). Note that dry etching that uses a mixed gas made of $SiCl_4$, $SF_6$, and $N_2$ is also effective in removing the contact layer 38 selectively and in different direction with respect to the Schottky layer 37, so that it is possible to form a tiny opening in the pattern based on this method.

Lastly, a gate metal made of a metal, for instance, of Ti, Pt and Au is vapor-deposited all over the epitaxial layer 30, and by lifting it off, the gate electrode 12 is formed on the Schottky layer 37 whose opening is exposed, and the buffer layer 33 where the gate electrode separation trench 15 is exposed (see FIG. 5(e)).

As described above, according to the GaAs FET of the present embodiment, the finger portions 13a and 14a as well as the common portions 13b and 14b of the source electrode 13 and the drain electrode 14 are both formed on the mesa 11, and an ohmic junction is formed between the GaAs FET and the semiconductor layer. Therefore, the side gate effects can be eliminated, and degradation of the field-effect transistor characteristics can be reduced. The elimination of the side gate effects can simultaneously reduce the drain-source distance, and thereby, it is possible to miniaturize the GaAs FET.

According to the GaAs FET of the present embodiment, the part located below the straight portion 12a of the gate electrode 12 is separated from the part located below the corner portion 12b of the gate electrode 12, so that the corner portion 12b of the gate electrode 12 does not function as a gate of the transistor. That is to say, the operation of the transistor that is placed in the corner portion 12b of the gate electrode 12 is stopped. Therefore, it is possible to allow the field-effect transistor to operate with stability.

Second Embodiment

Figure 6A:
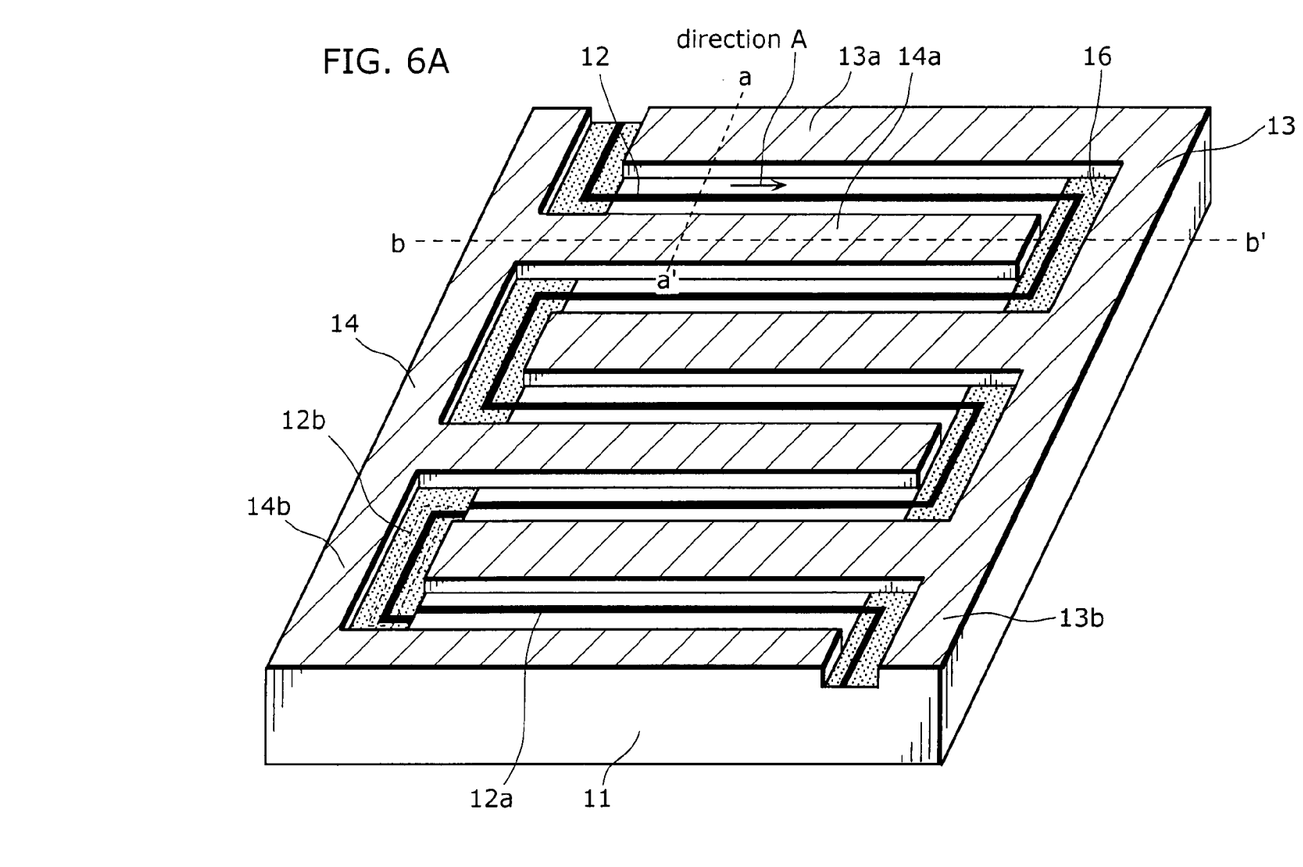
FIG. 6A is an outer view of the GaAs FET according to a second embodiment of the present invention.
Figure 6B:
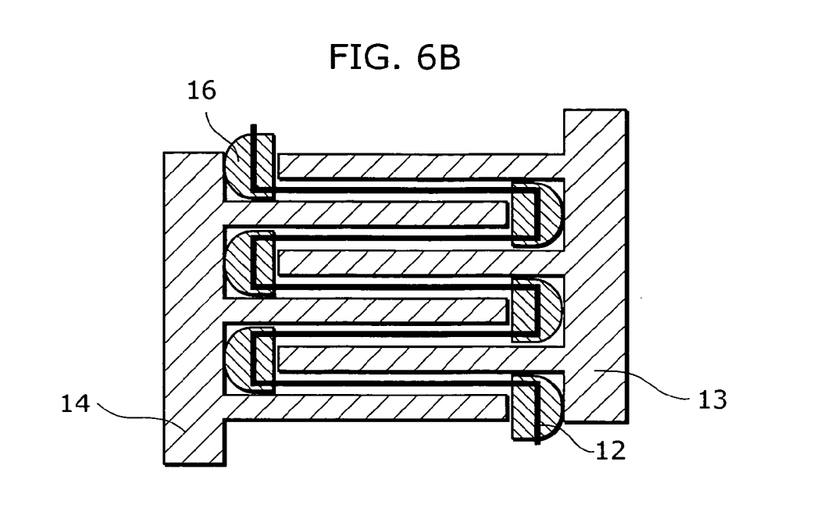
FIG. 6B is a top view of the GaAs FET according to the second embodiment.
Figure 6C:
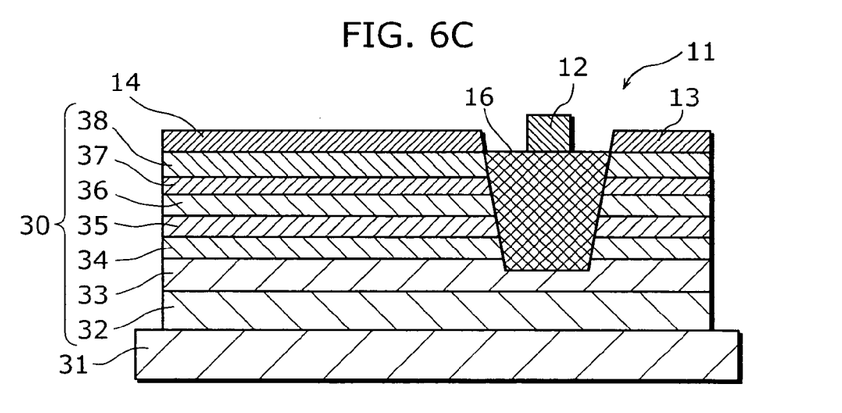
FIG. 6C is a cross-sectional view, at the line b-b' shown in FIG. 6A, of the GaAs according to the second embodiment.
Figure 6D:
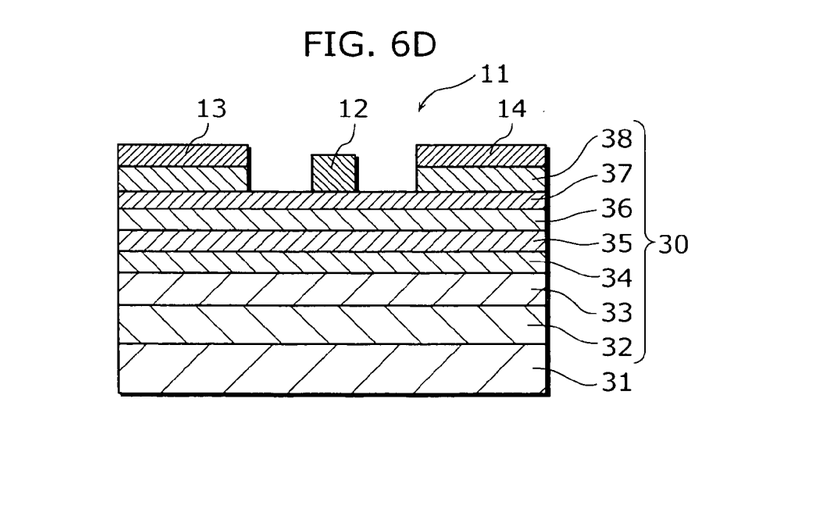
FIG. 6D is a cross-sectional view, at the line a-a' shown in FIG. 6A, of the GaAs FET according to the second embodiment.

FIG. 6A shows an outer view of the GaAs FET of the present embodiment and FIG. 6B shows a top view of the GaAs FET, while FIG. 6C shows a cross-sectional view of the GaAs FET at the line b-b' shown in FIG. 6A and FIG. 6D shows a cross-sectional view of the GaAs FET at the line a-a' shown in FIG. 6A.

The GaAs FET is comprised of a substrate 31 and an epitaxial layer 30. The epitaxial layer 30 is structured by sequentially stacking the buffer layers 32 and 33, the channel layer 34, the spacer layer 35, the carrier supplying layer 36, the Schottky layer 37 and the contact layer 38. Here, the source electrode 13 and the drain electrode 14 are formed on the contact layer 38. In the area between the source electrode 13 and the drain electrode 14, etching is performed on the contact layer 38 so that the surface of the Schottky layer 37 is exposed as a surface of the epitaxial layer 30, and the gate electrode 12 is formed on the Schottky layer 37 thus exposed.

The GaAs FET is a multi-finger FET in which plural unit FETs are connected electrically and in parallel, and has a layout in which the finger portions 13a and 14a of the comb-shaped source electrode 13 and drain electrode 14 are placed opposite each other so that the finger portions 13a and 14a interdigitate, and one gate electrode 12 is formed in meandering shape between the source electrode 13 and the drain electrode 14.

The followings are formed on the mesa 11: the finger portions 13a and 14a as well as the common portions 13b and 14b of the respective source electrode 13 and drain electrode 14; and the straight portion 12a of the gate electrode 12 that is almost in parallel to the finger portion 13a; and the corner portion 12b which connects the neighboring straight portions 12a.

The mesa 11 has a layer structure in which the buffer layers 32 and 33, the channel layer 34, the spacer layer 35, the carrier supplying layer 36, the Schottky layer 37 and the contact layer 38 are sequentially stacked. Here, in the part located below the corner portion 12b of the gate electrode 12 in the mesa 11, a high-resistance region 16, which cuts across the channel layer 34, the spacer layer 35, the carrier supplying layer 36, the Schottky layer 37 and the contact layer 38 and reaches the buffer layer 33, is formed. The part located below the corner portion 12b is electrically separated from the part located below the straight portion 12a, and therefore, does not function as a transistor. The high-resistance region 16 is formed by performing ion implantation onto the epitaxial layer 30 with impurities such as oxygen (O), boron (B) and helium (He) and destroying crystallizability of the epitaxial layer 30 so as to make the epitaxial layer 30 partly high-resistant.

The following describes the method of manufacturing the GaAs FET that has the structure as described above, with reference to the diagrams.

FIGS. 7(a) through 7(e) are cross-sectional views of the GaAs FET.

Figure 7:
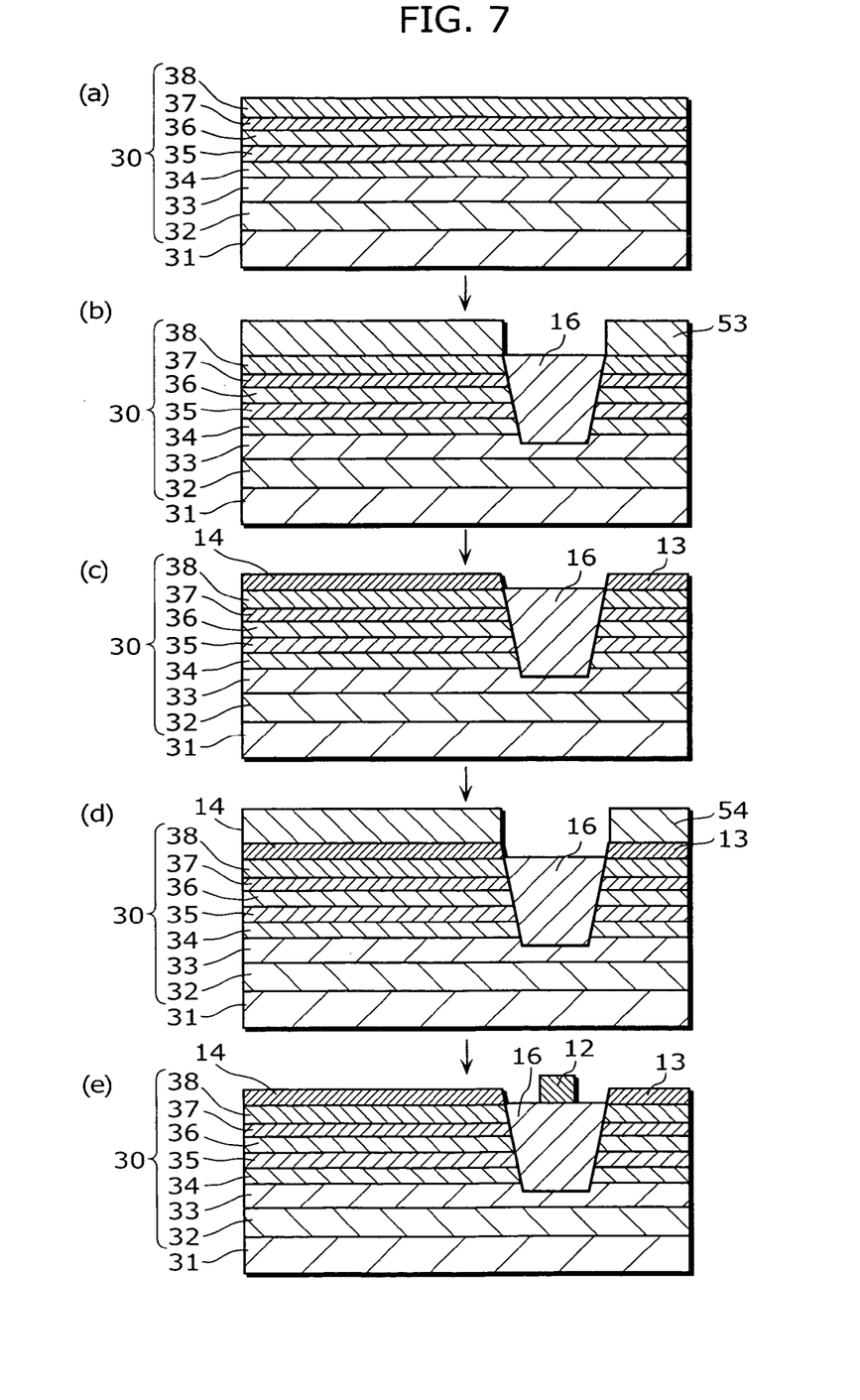
FIGS. 7(a) through 7(e) are cross-sectional views of the GaAs FET according to the second embodiment for describing the manufacturing method of the GaAs FET.

The epitaxial layer 30 is formed on the substrate 31 by sequentially growing, by epitaxial growth with the use of an MOCVD method or an MBE method, the buffers 32 and 33, the channel layer 34, the spacer layer 35, the carrier supplying layer 36, the Schottky layer 37 and the contact layer 38 (see FIG. 7(a)).

Wet etching using, for example, a solution of phosphoric acid, oxygenated water and water, is performed on the epitaxial layer 30 so that an element separation region is formed. After that, a predetermined place is protected by forming a pattern by a photo resist 53, and then, a high-resistance region 16 is formed, reaching the buffer layer 33 located lower than the channel layer 34, by ion implanting, e.g, with boron, a predetermined area of the contact layer 38, Schottky layer 37, the carrier supplying layer 36, the spacer layer 35, the channel layer 34 and the buffer layer 33 (see FIG. 7(b)).

Then, after the removal of the photoresist 53, a pattern is formed using another photoresist, an ohmic metal made of metal composed of Ni, Au and Ge is vapor-deposited all over the surface of the epitaxial layer 30, and by lifting it off, the drain electrode 14 and the source electrode 13 are formed (see FIG. 7(c)).

After the formation of the photo resist 54, an opening is formed by performing recess etching onto a predetermined area of the contact layer 38 between the source electrode 13 and the drain electrode 14 (see FIG. 7(d)). Note that dry etching that uses a mixed gas made of $SiCl_4$, $SF_6$, and $N_2$ is also effective in removing the contact layer 38 selectively and in different direction with respect to the Schottky layer 37, it is possible to form a tiny opening in the pattern based on this method.

Lastly, a gate metal made of a metal, for instance, of Ti, Pt and Au is vapor-deposited all over the epitaxial layer 30, and by lifting it off, the gate electrode 12 is formed on the high-resistance region 16 that is partly formed in the contact layer 38 (see FIG. 7(e)).

As described above, the GaAs FET of the present embodiment, as is the case of the GaAs FET described in the first embodiment, can reduce the degradation of the field-effect transistor characteristics, and also, miniaturize the GaAs FET transistor.

According to the GaAs FET of the present embodiment, the straight portion 12a of the gate electrode 12 is separated from the corner portion 12b of the gate electrode 12 by a high-resistance region 16 so that the corner portion 12b does not function as a transistor. That is to say, the operation of the transistor that is placed in the corner portion 12b of the gate electrode 12 is stopped. Therefore, it is possible to allow the field-effect transistor to operate with stability.

As described above, the FET according to the present invention is described based on the embodiments. The present invention, however is not limited to these embodiments. Variation of each embodiment that is conceivable by a skilled person within the scope of the present invention shall be included in the present invention.

For example, the FET according to the present invention may be a double-hetero FET.

INDUSTRIAL APPLICABILITY

The present invention is suitable for use as a FET, and especially as an RF amplifier, an oscillator, an electric amplifier or the like that uses the FET.

What is claimed is:

1. A field-effect transistor, comprising:
a substrate;
a mesa which is formed on said substrate and includes a channel layer;
a source electrode and a drain electrode being formed on said mesa, each of said source and drain electrodes being configured to form a comb-shape comprising finger portions and a common portion, respective finger portions of said source electrode and said drain electrode being positioned opposite each other so as to interdigitate; and a gate electrode formed on said mesa, said gate electrode comprising straight portions parallel to the finger portions and a corner portion connecting the neighboring straight portions and said gate electrode configured to form a meandering-shape between said source electrode and said drain electrode, wherein said common portions of said source and drain electrodes are formed on said mesa, and form ohmic contact to the mesa.

2. The field-effect transistor claim 1,
wherein a part located below the corner portion of said gate electrode on said mesa is electrically separated from a part located below the straight portions so as to prevent the part located below the corner portion from working as a transistor.

3. The field-effect transistor of claim 2,
wherein a trench is formed in said mesa, cutting across the channel layer, and the corner portion of said gate electrode is formed in the trench.

4. The field-effect transistor of claim 3,
wherein said mesa has a layer structure in which a buffer layer, the channel layer, a carrier supplying layer, a Schottky layer and a contact layer are sequentially stacked,
the trench is formed by etching which is performed on the contact layer so that the buffer layer is exposed,
the finger portions and the common portions of said respective source and drain electrodes are formed on the contact layer, and
the corner portion of the gate electrode is formed on the buffer layer which is exposed as a result of the formation of the trench.

5. The field-effect transistor of claim 2, wherein a high-resistance region is formed in said mesa, cutting across the channel layer,
the corner portion of said gate electrode is formed on the high-resistance region, and
the straight portion of said gate electrode is formed on said mesa, on a part where the high-resistance region is not formed.

6. The field-effect transistor of claim 5,
wherein said mesa has a layer structure in which a buffer layer, a channel layer, a carrier supplying layer, a Schottky layer and a contact layer are sequentially stacked,
the high-resistance region is partly formed, reaching the buffer layer, by implantation of impurities into the contact layer,
the common portions and the finger portions of said source and drain electrodes are formed on the contact layer, and
the corner portion of said gate electrode is formed on the high-resistance region which is partly formed in the contact layer.

7. The field-effect transistor of claim 1,
wherein the finger portions and the common portions of said source and drain electrodes are formed so that the surface of the finger portions are flush with the surface of the common portions.

8. The field-effect transistor of claim 1,
wherein a top surface of said substrate is at a (100) plane orientation, and an angle formed between a direction of the straight portion of the gate electrode and a <0-1-1> direction of said substrate is 45 degrees.

9. A field-effect transistor, comprising:
a substrate;
a mesa which is formed on said substrate and includes a channel layer; and a source electrode, a drain electrode and a gate electrode which are formed on said mesa, said source electrode and said drain electrode respectively being formed in a comb-shape, said gate electrode being formed in a meandering shape, wherein, on said mesa, a top-surface pattern is formed in which respective finger portions of said source electrode and said drain electrode are positioned opposite each other so as to interdigitate, and said gate electrode is formed between said source electrode and said drain electrode, common portions, each being a base part of the finger portions of said source electrode and said drain electrode, are formed on said mesa, a part of said mesa located below a straight portion of said gate electrode which is parallel to the finger portions is electrically separated from a part located below a corner portion of said gate electrode that connects neighboring straight portions, the part located below the corner portion of said gate electrode in said mesa does not function as a transistor, and a trench is formed in said mesa, cutting across the channel layer, and the corner portion of said gate electrode is formed in the trench.

10. The field-effect transistor of claim 9, wherein said mesa has a layer structure in which a buffer layer, the channel layer, a carrier supplying layer, a Schottky layer and a contact layer are sequentially stacked, the trench being formed by etching which is performed on the contact layer so that the buffer layer is exposed, the finger portions and the common portions of said respective source electrode and drain electrode are formed on the contact layer, and the corner portion of the gate electrode is formed on the buffer layer which is exposed as a result of the formation of the trench.

11. A field-effect transistor, comprising:
a substrate;
a mesa which is formed on said substrate and includes a channel layer; and
a source electrode, a drain electrode and a gate electrode which are formed on said mesa, said source electrode and said drain electrode respectively being formed in a comb-shape, said gate electrode being formed in a meandering shape, wherein, on said mesa, a top-surface pattern is formed in which respective finger portions of said source electrode and said drain electrode are positioned opposite each other so as to interdigitate, and said gate electrode is formed between said source electrode and said drain electrode, common portions, each being a base part of the finger portions of said source electrode and said drain electrode, are formed on said mesa, a part of said mesa located below a straight portion of said gate electrode which is parallel to the finger portions is electrically separated from a part located below a corner portion of said gate electrode that connects neighboring straight portions, wherein a top surface of said substrate is at a (100) basal plane, and an angle $\Theta$ formed between a direction of the straight portion of the gate electrode and a <0-1-1> direction of said substrate is 45 degrees.

* * * * *